United States Patent
Huang et al.

(10) Patent No.: US 9,443,961 B2
(45) Date of Patent: Sep. 13, 2016

(54) SEMICONDUCTOR STRIPS WITH UNDERCUTS AND METHODS FOR FORMING THE SAME

(71) Applicant: Taiwan Semiconductor Manufacturing Company, Ltd., Hsin-Chu (TW)

(72) Inventors: Tai-Chun Huang, Hsin-Chu (TW);
Chih-Tang Peng, Zhubei (TW);
Chia-Wei Chang, Taichung (TW);
Ming-Hua Yu, Hsin-Chu (TW);
Hao-Ming Lien, Hsin-Chu (TW);
Chao-Cheng Chen, Hsin-Chu (TW);
Tze-Liang Lee, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 168 days.

(21) Appl. No.: 13/866,841

(22) Filed: Apr. 19, 2013

(65) Prior Publication Data

US 2014/0264491 A1    Sep. 18, 2014

Related U.S. Application Data

(60) Provisional application No. 61/778,303, filed on Mar. 12, 2013.

(51) Int. Cl.
| | | |
|---|---|---|
| H01L 29/78 | (2006.01) | |
| H01L 29/66 | (2006.01) | |
| H01L 21/84 | (2006.01) | |
| H01L 21/764 | (2006.01) | |
| H01L 29/423 | (2006.01) | |

(52) U.S. Cl.
CPC ....... *H01L 29/66795* (2013.01); *H01L 21/845* (2013.01); *H01L 29/785* (2013.01); *H01L 21/764* (2013.01); *H01L 29/42392* (2013.01); *H01L 29/7856* (2013.01)

(58) Field of Classification Search
CPC ............. H01L 21/764; H01L 21/7682; H01L 21/76264; H01L 29/06; H01L 29/0649; H01L 29/4983; H01L 29/4991; H01L 21/845; H01L 29/764; H01L 21/501; H01L 29/785; H01L 29/7856; H01L 29/41791; H01L 29/42392
See application file for complete search history.

(56) References Cited

U.S. PATENT DOCUMENTS

| | | | | |
|---|---|---|---|---|
| 6,613,652 B2 * | 9/2003 | Lim et al. | ...................... | 438/459 |
| 6,642,557 B2 * | 11/2003 | Liang | .................... | H01L 21/762 257/213 |
| 7,803,690 B2 * | 9/2010 | Yu et al. | ....................... | 438/413 |

(Continued)

FOREIGN PATENT DOCUMENTS

| | | |
|---|---|---|
| KR | 20070050164 A | 5/2007 |
| KR | 1020110040651 A | 4/2011 |
| TW | 201133792 | 10/2011 |

*Primary Examiner* — Matthew W Such
*Assistant Examiner* — Stephen C Smith
(74) *Attorney, Agent, or Firm* — Slater Matsil, LLP

(57) ABSTRACT

An integrated circuit device includes a semiconductor substrate, and a semiconductor strip extending into the semiconductor substrate. A first and a second dielectric region are on opposite sides of, and in contact with, the semiconductor strip. Each of the first dielectric region and the second dielectric region includes a first portion level with the semiconductor strip, and a second portion lower than the semiconductor strip. The second portion further includes a portion overlapped by the semiconductor strip.

20 Claims, 16 Drawing Sheets

(56) References Cited

U.S. PATENT DOCUMENTS

| | | |
|---|---|---|
| 8,120,094 B2 | 2/2012 | Liaw et al. |
| 8,492,235 B2 * | 7/2013 | Toh ................... H01L 29/66795 257/E29.022 |
| 8,502,279 B2 * | 8/2013 | Toh ........................ B82Y 10/00 257/254 |
| 8,941,153 B2 | 1/2015 | Lee et al. |
| 9,000,522 B2 * | 4/2015 | Cheng ............... H01L 21/76283 257/347 |
| 2007/0063282 A1 * | 3/2007 | Yang ................... H01L 27/1203 257/347 |
| 2009/0315112 A1 * | 12/2009 | Lee ............................. 257/355 |
| 2011/0084340 A1 | 4/2011 | Yuan et al. |
| 2011/0210393 A1 * | 9/2011 | Chen et al. .................... 257/347 |
| 2012/0292707 A1 * | 11/2012 | Toh ........................ B82Y 10/00 257/365 |

* cited by examiner

SEMICONDUCTOR STRIPS WITH UNDERCUTS AND METHODS FOR FORMING THE SAME

This application claims the benefit of the following provisionally filed U.S. patent application: Application Ser. No. 61/778,303, filed Mar. 12, 2013, and entitled "Semiconductor Strips with Undercuts and Methods for Forming the Same," which application is hereby incorporated herein by reference.

BACKGROUND

Transistors are key components of modern integrated circuits. To satisfy the requirements of increasingly faster speed, the drive currents of transistors need to be increasingly greater. To achieve this increase in performance, the gate lengths of transistors are constantly being scaled down. Scaling down the gate lengths, however, leads to undesirable effects known as "short-channel effects," in which the control of current flow by the gates is compromised. Among the short-channel effects are the Drain-Induced Barrier Lowering (DIBL) and the degradation of sub-threshold slope, both of which resulting in the degradation in the performance of transistors.

The use of a multi-gate transistor architecture may help the relief of short-channel effects. Fin Field-Effect Transistors (FinFET) were thus developed. FinFETs have increased channel widths. The increase in the channel widths is achieved by forming channels that include portions on the sidewalls of semiconductor fins and portions on the top surfaces of the semiconductor fins. Since the drive currents of transistors are proportional to the channel widths, the drive currents of the FinFETs are increased.

In an existing FinFET formation process, Shallow Trench Isolation (STI) regions are first formed in a silicon substrate. The STI regions are then recessed to form silicon fins, which are portions of the silicon substrate that are over the recessed STI regions. Next, a gate dielectric, a gate electrode, and source and drain regions are formed to finish the formation of the FinFET. In the respective FinFET, the channel includes both the sidewalls and the top surfaces of the semiconductor fins, and hence the drive current of the FinFET is high with relative to the chip area used by the FinFET. Accordingly, FinFET is becoming a trend in recent generations of integrated circuits.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable concepts that can be embodied in a wide variety of specific contexts. The specific embodiments discussed are illustrative, and do not limit the scope of the disclosure.

A Field-Effect Transistor (FinFET) and the method of forming the same are provided in accordance with various exemplary embodiments. The intermediate stages of forming the FinFET are illustrated. The variations and the operation of the FinFET in accordance with the embodiments are discussed. Throughout the various views and illustrative embodiments, like reference numbers are used to designate like elements.

FIGS. 1A through 9C are cross-sectional views and top views of intermediate stages in the manufacturing of Fin Field-Effect Transistors (FinFETs) in accordance with some exemplary embodiments. Each of the FIGS. 1A-9C is referenced with one of letters "A," "B," and "C," wherein all figures with the numbers ending with letter "A" are the top views of a respective wafer 100, on which the FinFET is formed. All figures with the numbers ending with letter "B" are obtained from a plane crossing line B-B' of the respective top view. All figures with the numbers ending with letter "C" are obtained from a plane crossing line C-C' of the respective top view.

Figure 1A:
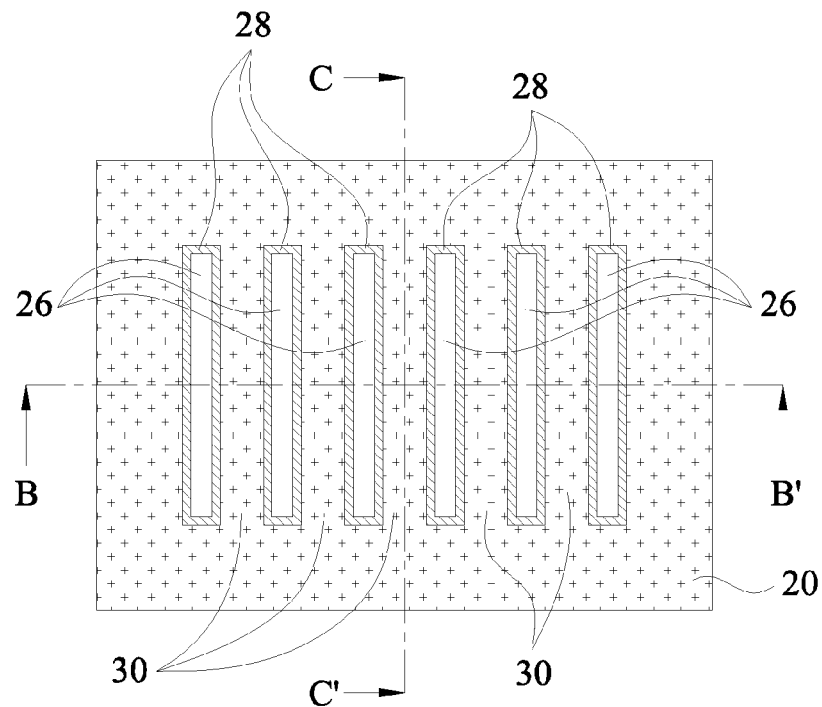
FIGS. 1A through 9C are cross-sectional views and top views of intermediate stages in the manufacturing of Fin Field-Effect Transistors (FinFETs) in accordance with some exemplary embodiments.
Figure 1B:
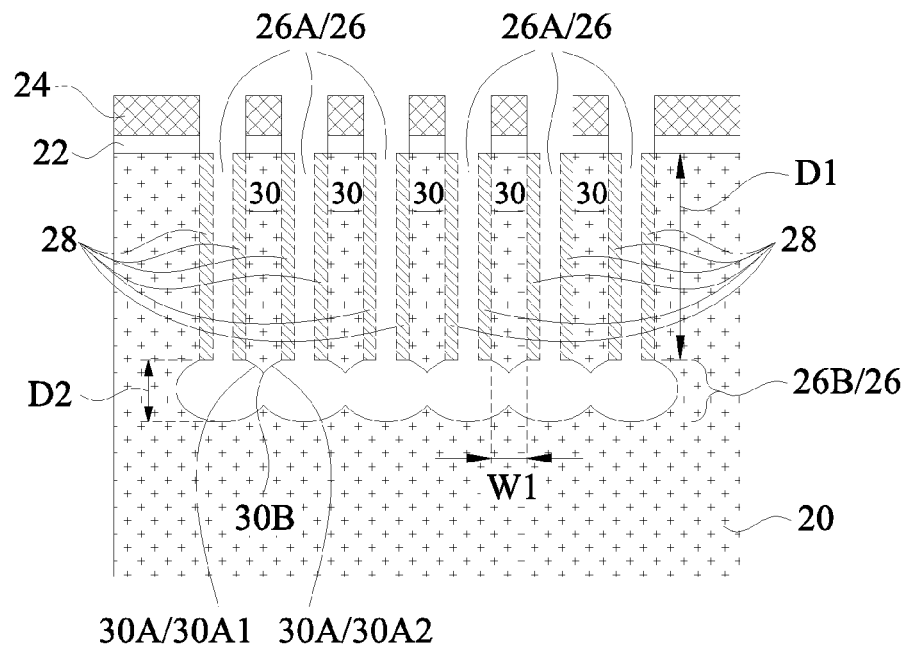
Figure 1C:
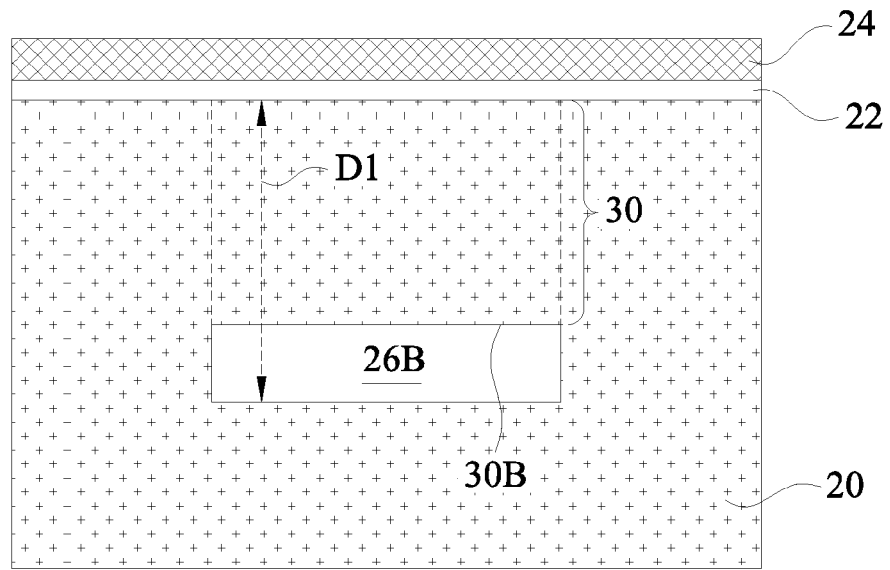

FIGS. 1A, 1B, and 1C illustrate the formation of trenches 26 in substrate 20, which is a portion of a wafer. Substrate 20 may be semiconductor substrate, which may be, for example, a silicon substrate, a silicon germanium substrate, or a substrate formed of other semiconductor materials. Substrate 20 is a bulk substrate in accordance with some embodiments. In some embodiments, substrate 20 is lightly doped with a p-type or an n-type impurity.

Referring to FIG. 1B, pad layer 22 and mask layer 24 may be formed on semiconductor substrate 20. Pad layer 22 may be a thin film comprising silicon oxide formed, for example, using a thermal oxidation process. Pad layer 22 may act as an adhesion layer between semiconductor substrate 20 and mask layer 24. Pad layer 22 may also act as an etch stop layer for etching mask layer 24. In some embodiments, mask layer 24 is formed of silicon nitride, for example, using Low-Pressure Chemical Vapor Deposition (LPCVD). In other embodiments, mask layer 24 is formed by thermal nitridation of silicon, Plasma Enhanced Chemical Vapor Deposition (PECVD), or plasma anodic nitridation. Mask layer 24 is used as a hard mask during the subsequent photolithography processes.

As shown in FIG. 1B, in order to form trenches 26, mask layer 24 and pad layer 22 are etched, exposing underlying semiconductor substrate 20. The exposed semiconductor substrate 20 is then etched, forming trenches 26. The portions of semiconductor substrate 20 between neighboring trenches 26 form semiconductor strips 30. Trenches 26 may be strips (when viewed in the top view of wafer 100, FIG. 1A) that are parallel to each other. The portions of semiconductor substrate 20 between neighboring trenches 26 are referred to as semiconductor strips 30 hereinafter.

Referring again to FIG. 1B, in accordance with some embodiments, the formation of trenches 26 include two stages. In the first stage, trench portions 26A, which have substantially straight sidewalls, are formed. The formation of trench portions 26 may comprise an anisotropic dry etch. During the etching for forming trench portions 26, etchant gases such as HBr, $CH_2F_2$, oxygen ($O_2$), chlorine ($Cl_2$), and/or the like, may be used, wherein plasma is generated from the etchant gas to perform the etching. In accordance with some embodiments, in the first etching step, a bias voltage ranging from about 100 V to about 300 V is applied on substrate 20. The pressure of the chamber, in which the etching is performed, may be between about 5 mTorr and about 30 mTorr in accordance with some embodiments. Depth D1 of trench portions 26A may be between about 30 Å and about 1,500 Å in accordance with some embodiments.

In the first etching stage, the etchant gas is so selected, so that polymer 28 is generated as a by-product of the etching. For example, $CH_2F_2$ may be selected for it tendency for generating polymer 28. In addition, process conditions are adjusted, and the process conditions suitable for generating thicker polymer 28 may be selected. During the first etching stage, the sidewalls of trench portions 26A are protected by polymer 28, and the bottoms of trench portions 26A are not protected by polymer 28. After the first etching stage, a second etching stage is performed to further extend trenches 26 down, and to expand trenches 26 laterally to form trench portions 26B. In some embodiments, the second etching stage is more isotropic than the first etching stage, and may include both the anisotropic component and the isotropic component. In alternative embodiments, the second etch stage is an isotropic etch. The second etching stage may also be performed using dry plasma etching, and may be performed using an etchant gas less prone to generating polymer. For example, the etching gas may include $SF_6$ and $O_2$. In the second etching stage, the bias voltage applied on substrate 20 is smaller than the bias voltage applied during the first etching stage in accordance with some exemplary embodiments. After the second etching stage, polymer 28 is removed.

Due to the protection of polymer 28, in the second etching stage, trench portions 26A are not expanded laterally. The bottoms of trench portions 26A are not protected by polymer 28, and hence substrate 20 is etched from the bottoms of trench portions 26A, resulting in trench portions 26B to be formed. Due to the isotropic behavior of the second etching stage, trench portions 26B expand laterally and vertically at the same time. By controlling the etching time, neighboring trench portions 26B may be connected to each other, and hence form a continuous opening underneath a plurality of semiconductor strips 30. The interconnection of neighboring trench portions 26B in FIG. 1B may be achieved, for example, by ensuring depth D2 of trench portions 26B to be greater than the width W1 of semiconductor strips 30.

In accordance with some embodiments, due to the isotropic etching, bottom surfaces 30A of semiconductor strips 30 are not flat. Bottom surfaces 30A of some of semiconductor strips 30 may include portion 30A1 and portion 30A2, both being curved. Portions 30A1 and 30A2 face toward opposite directions. For example, in the exemplary FIG. 2B, the illustrated portion 30A1 faces left, and the illustrate portion 30A2 faces right. The connecting points 30B of portions 30A1 and 30A2 are the lowest points of the respective semiconductor strips 30. Although illustrated as a point in the cross-sectional view, the connecting point 30B is a line extending in the lengthwise direction of semiconductor strips 30, as illustrated in FIG. 1C. Furthermore, the leftmost part and the rightmost part of the illustrated trench portions 26B have curved boundaries that have the shapes of partial circles or partial ellipses. In some embodiments, the connecting point 30B is substantially aligned to a middle line of the respective overlying semiconductor strip 30.

FIG. 1C illustrates another cross-sectional view obtained from the plane crossing line C-C' in FIG. 1A, which shows that semiconductor strips 30 hang over trench portions 26B.

Figure 2A:
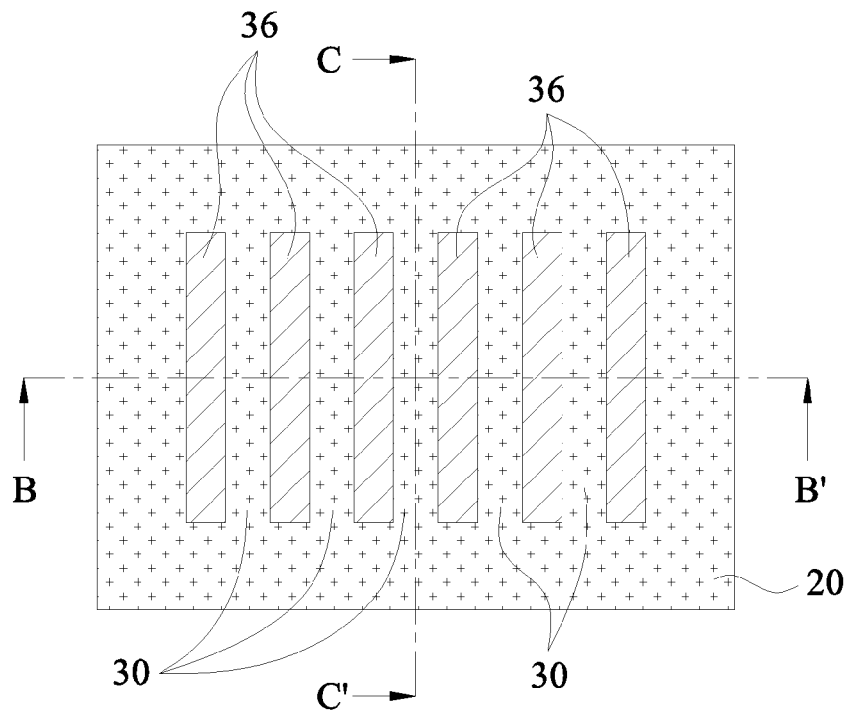
Figure 2B:
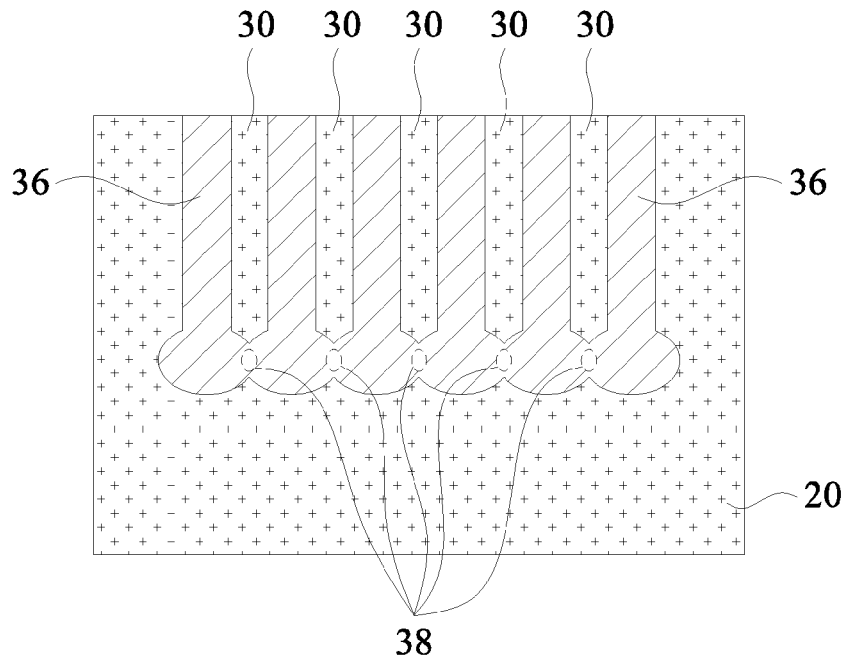
Figure 2C:
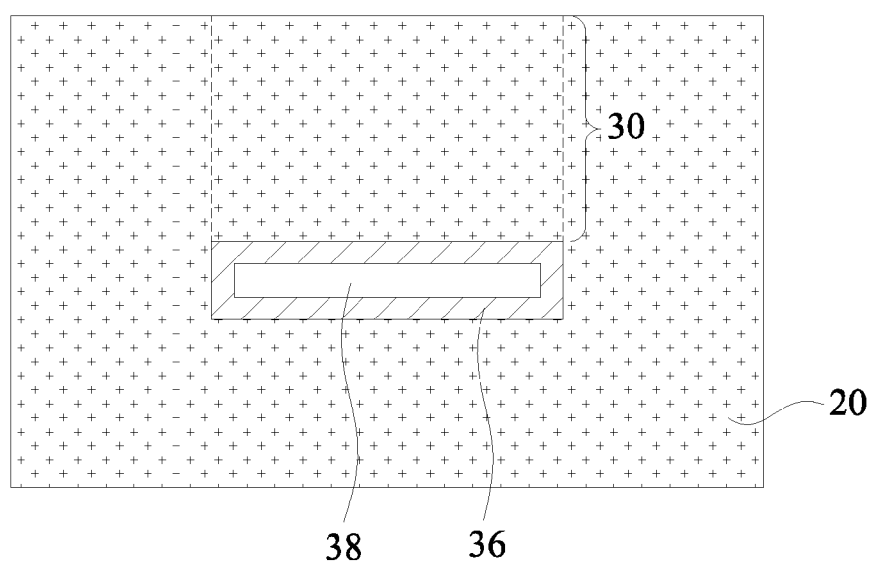

Referring to FIGS. 2A, 2B, and 2C, a dielectric material is filled into trenches 26 (FIGS. 1A, 1B, and 1C), followed by a planarization such as Chemical Mechanical Polish (CMP) to form dielectric regions 36. The dielectric material may comprise an oxide (such as silicon oxide), a nitride (such as silicon nitride), an oxynitride (such as silicon oxynitride), a carbide (such as silicon carbide), or the like. In some embodiments, the formation of dielectric regions 36 is performed using Flowable Chemical Vapor Deposition (FCVD). In other embodiments, dielectric regions 36 are formed using other gap-filling methods such as High Density Plasma Chemical Vapor Deposition (HDPCVD). Dielectric regions 36 fill trench portions 26A and 26B (FIG. 1B). The bottom surfaces 30A of semiconductor strips 30 are in contact with portions of dielectric regions 36, which portions are overlapped by semiconductor strips 30. Dielectric regions 36 filling trench portions 26B may be interconnected as a continuous dielectric region, which may have a non-flat top surface and a non-flat bottom surface.

After the filling of dielectric regions 36, an annealing may be performed. For example, the anneal may be performed at a temperature between about 200° C. and about 1,200° C. for a duration between about 30 minutes and about 120 minutes. The annealing chamber may be filled with process gases such as nitrogen ($N_2$), Ar, He, oxygen ($O_2$), Ozone, hydrogen ($H_2$), steam ($H_2O$), and/or the like. In alternative embodiments, the annealing is not performed at this stage. In some embodiments, mask layer 24 and pad layer 22 (FIGS. 1B and 1C) are removed after the formation of dielectric regions 36. In alternative embodiments, mask layer 24 and pad layer 22 are removed after dielectric regions 42 are formed, as shown in FIGS. 4A, 4B, and 4C.

In some embodiments, the entirety of trenches 26 is filled. In alternative embodiments, some of trench portions 26B are not fully filled, and air gaps 38 are formed therein. It is appreciated that although the term "air gaps" are used, gaps 38 are not necessarily filled with air, and may be filled with air, nitrogen, or other gases that fill the process chamber when dielectric regions 36 are formed. Gaps 38 may also be vacuumed in some embodiments. As shown in FIG. 2B, there may be a plurality of air gaps 38, each underlying, and possibly overlapped by, one of semiconductor strips 32. FIG. 2C illustrates that air gaps 38 may also formed a long strip having their lengthwise directions parallel to the lengthwise direction of semiconductor strips 30.

Figure 3A:
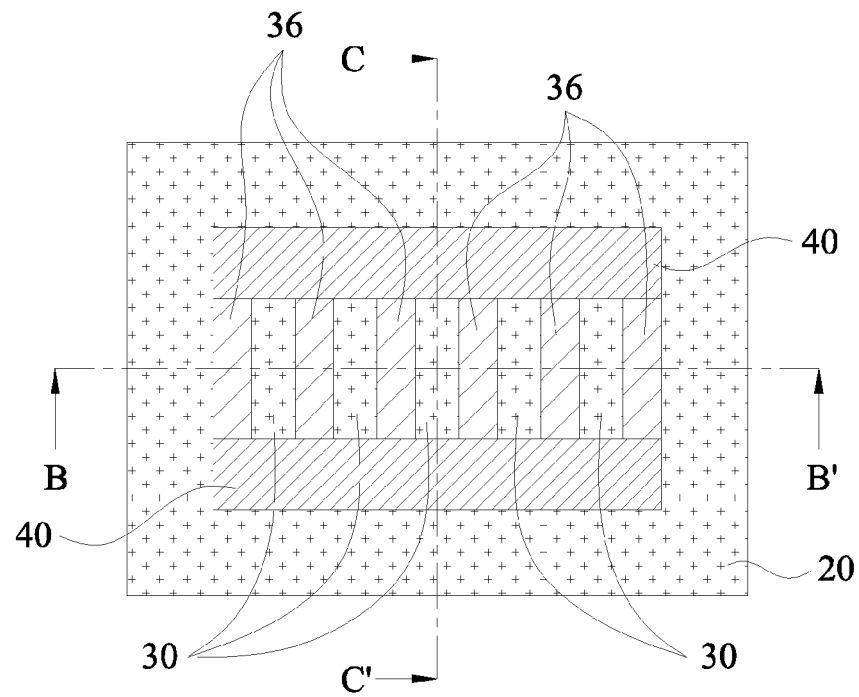
Figure 3B:
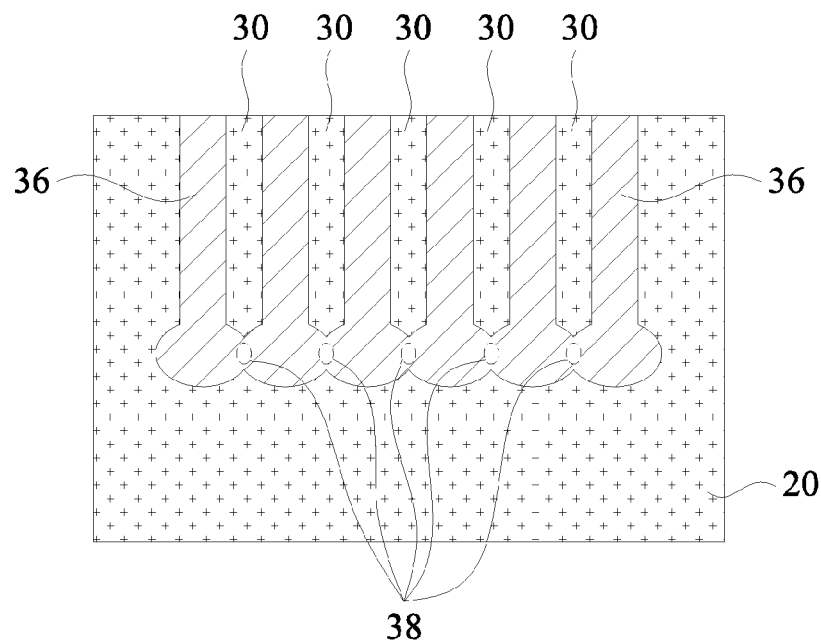
Figure 3C:
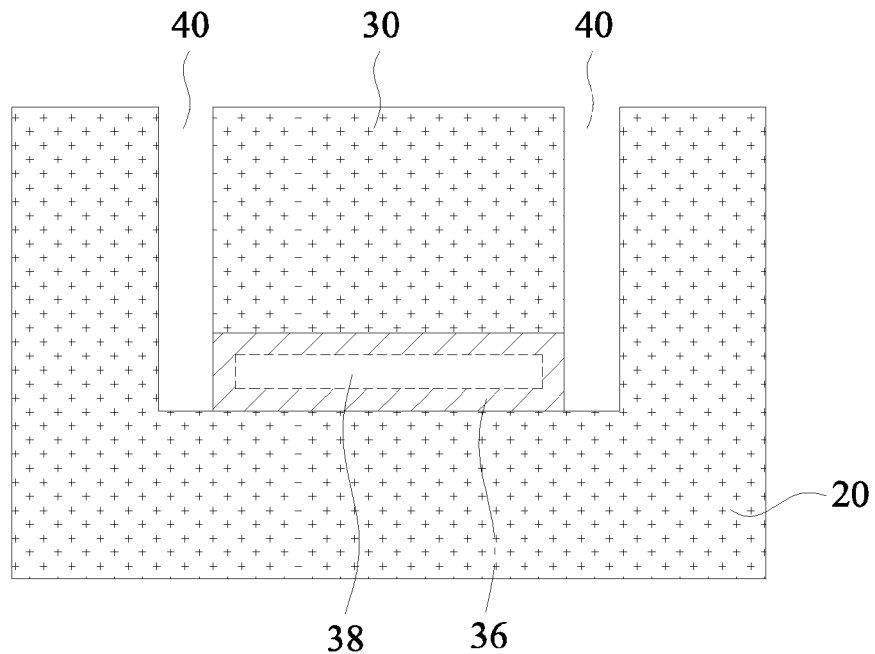

FIGS. 3A, 3B, and 3C illustrate the etching of end portions of dielectric regions 36 and semiconductor strips 30, and hence trenches 40 are formed. After the etching, the remaining middle portions of semiconductor strips 30 are physically and electrically disconnected from substrate 20. Since dielectric regions 36 comprise some portions underlying semiconductor strips 30, semiconductor strips 30 remain suspended without falling down. In accordance with some embodiments, the etching is performed using an anisotropic etching method, wherein etchant gases that are configured to attack dielectric regions 36 and semiconductor strips 30 are used. In some embodiments, the etchant gases comprise $CF_4$.

Figure 4A:
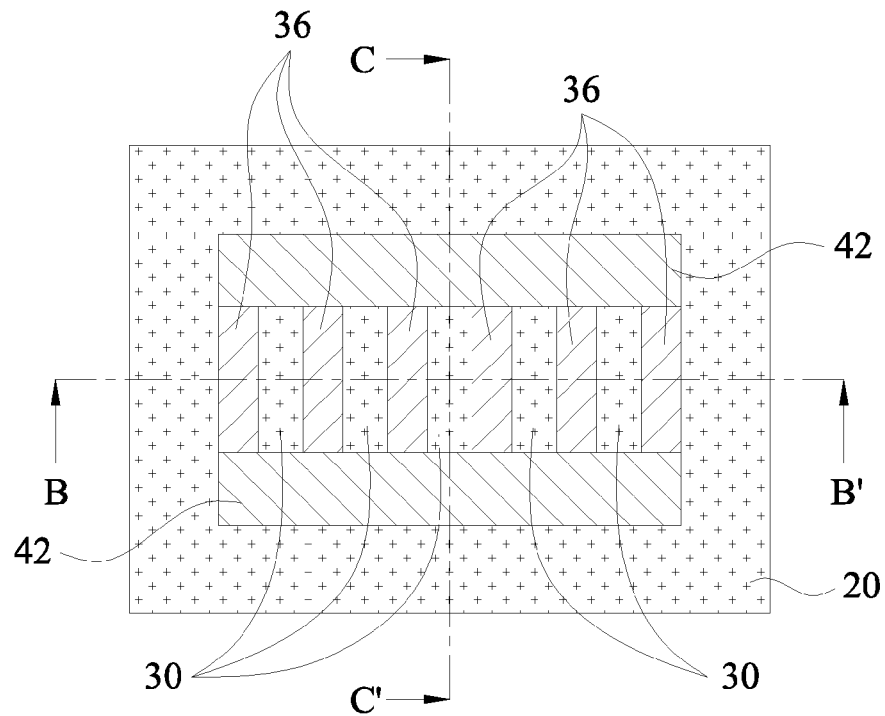
Figure 4B:
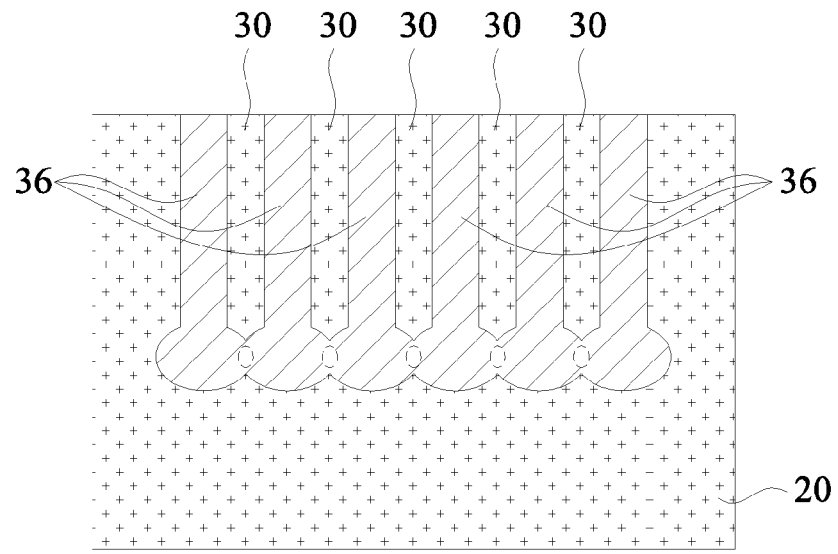
Figure 4C:
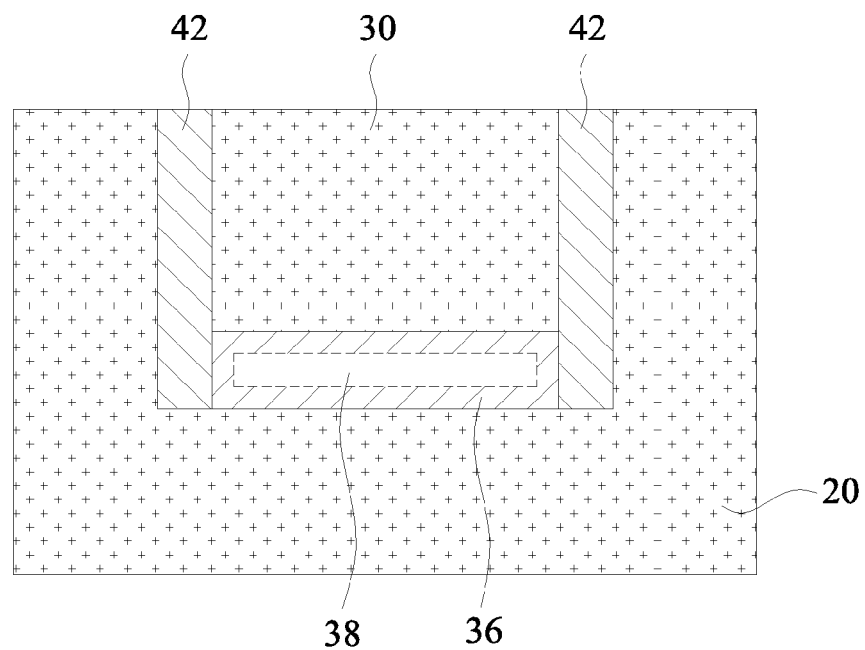

Next, a dielectric material is filled into trenches 40, and the resulting dielectric regions 42 are shown in FIGS. 4A, 4B, and 4C. The material of dielectric regions 42 may be selected from the same group of candidate materials for forming dielectric regions 36, which candidate materials include oxides, nitrides, oxynitrides, carbides, and the like. Furthermore, dielectric regions 42 may be formed using similar methods for forming dielectric regions 36, which methods include FCVD, HDPCVD, and the like. After the formation of dielectric regions 42, an annealing may be performed. In some embodiments, the annealing is performed at a temperature between about 200° C. and about 1,200° C. for a time period between about 30 minutes and about 120 minutes. The annealing chamber may be filled with process gases such as $N_2$, Ar, He, $O_2$, Ozone, $H_2$, $H_2O$, and/or the like. In alternative embodiments, the annealing step is skipped.

Dielectric regions 36 and 42 are formed of the same dielectric material in some embodiments. Accordingly, dielectric regions 36 and 42 are not distinguishable from each other, or may be distinguishable due to their different characteristics such as different densities, which may be caused by different process conditions and/or different annealing conditions. In alternative embodiments, dielectric regions 36 and 42 are formed of different materials, and hence may be distinguishable from each other. In these embodiments, the interfaces between dielectric regions 36 and 42 may be visible.

Figure 5A:
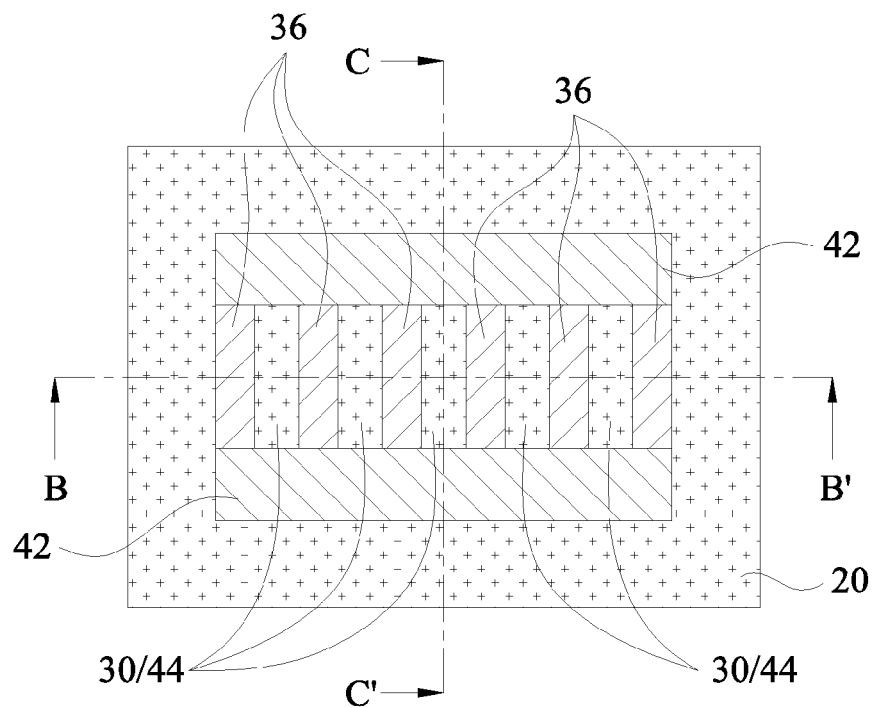
Figure 5B:
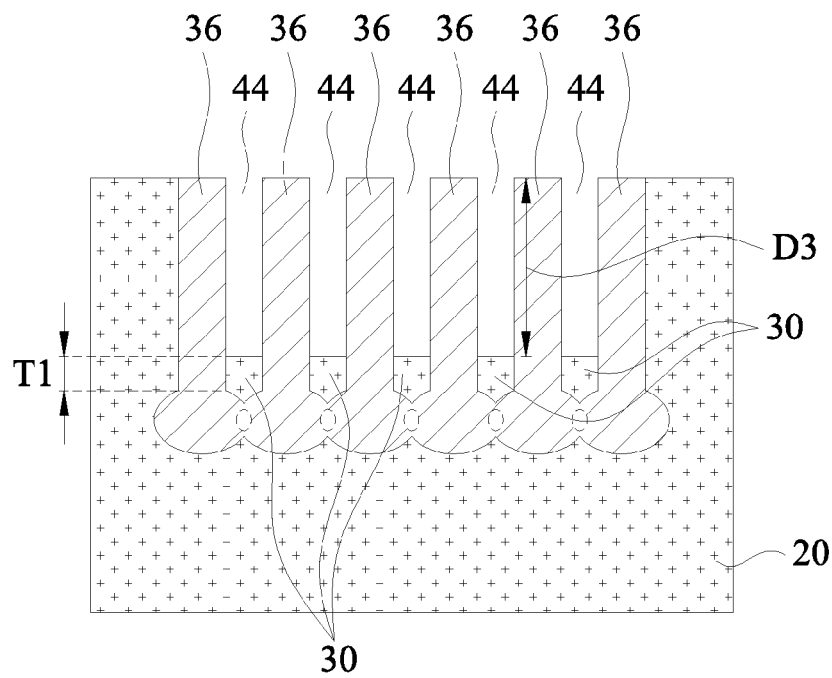
Figure 5C:
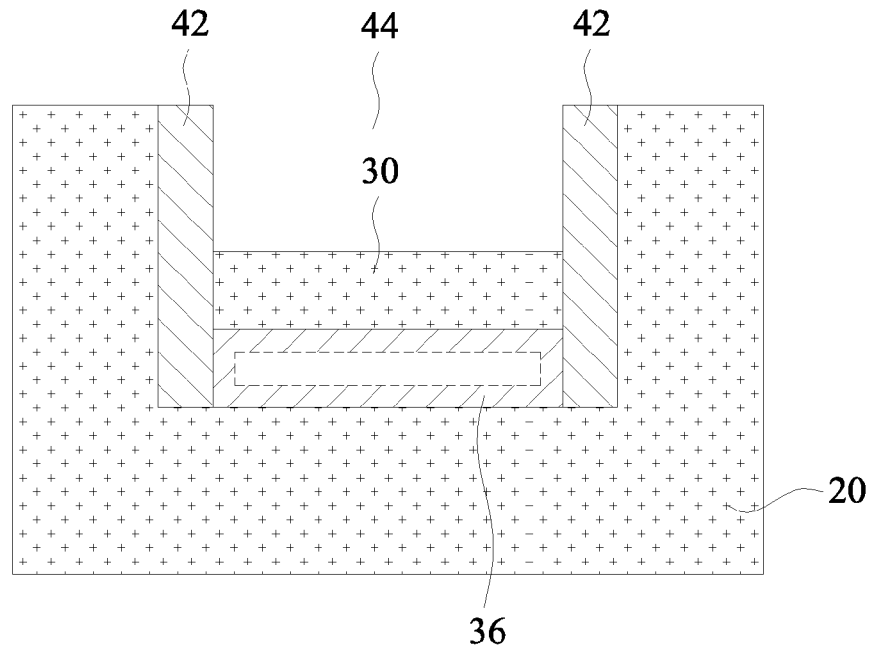

FIGS. 5A, 5B, and 5C and FIGS. 6A, 6B, and 6C illustrate some exemplary embodiments in which the material of the top portions of semiconductor strips are replaced with another semiconductor material. In alternative embodiments, the steps in FIGS. 5A through 6C are skipped. Referring to FIGS. 5A, 5B, and 5C, an etch step is performed to recess semiconductor strips 30, hence the top portions of semiconductor strips 30 are removed, and trenches 44 are formed. The bottom portions of semiconductor strips 30 remain, and are exposed to the resulting trenches 44. The thickness T1 of the remaining portions of semiconductor strips 30 may be greater than about 2 nm, so that the remaining semiconductor strips 30 act as the seed for the subsequent epitaxy. Trenches 44 may have depth D3 between, for example, about 30 nm and about 1,500 nm.

Figure 6A:
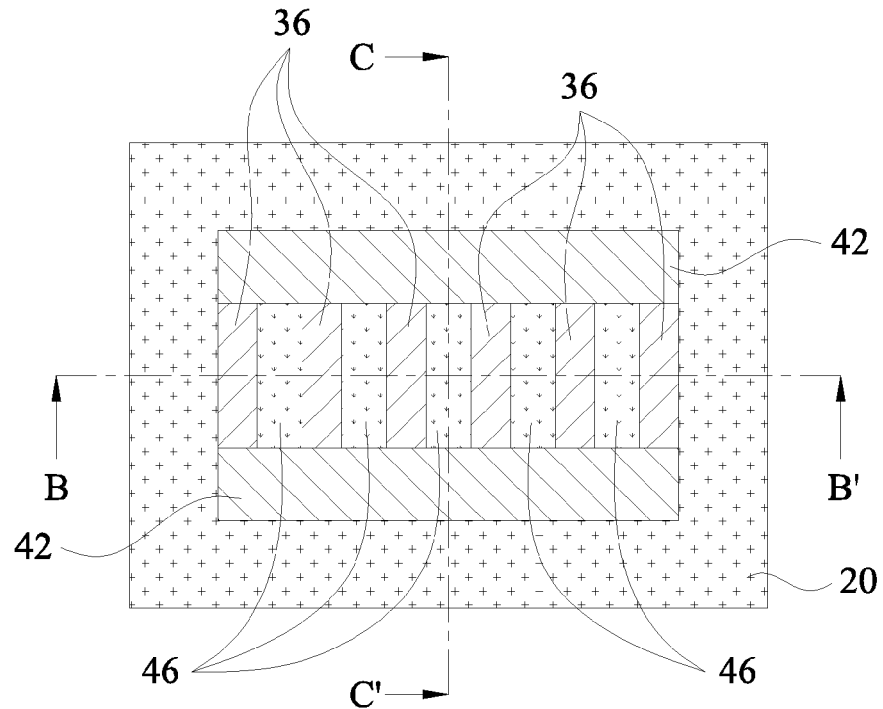
Figure 6B:
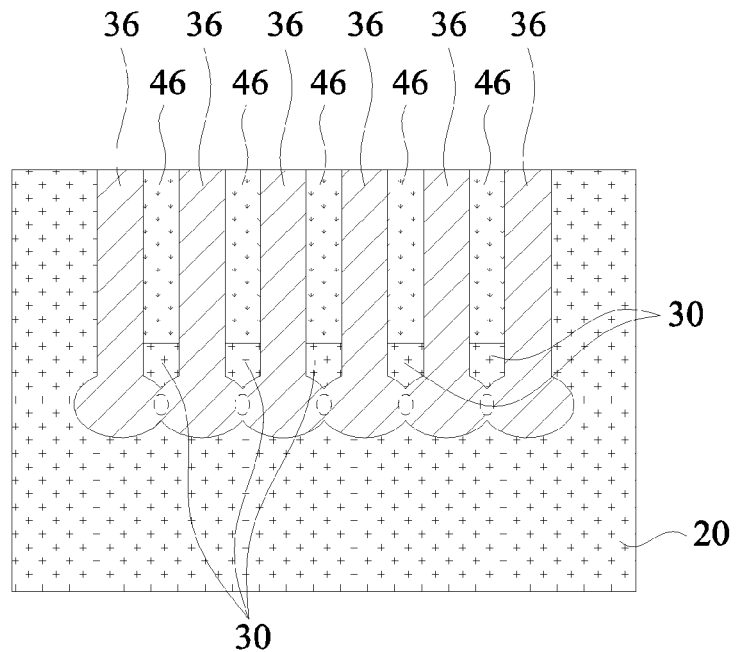
Figure 6C:
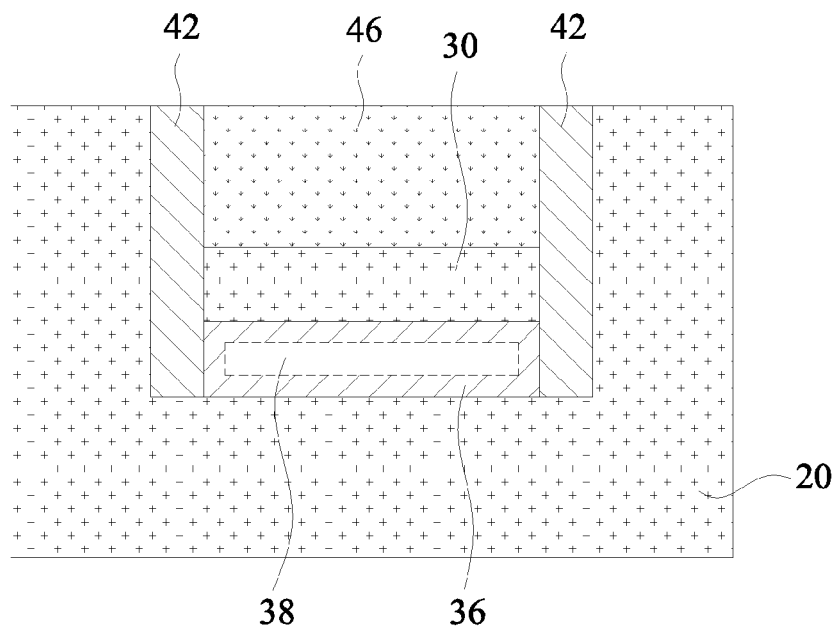

Next, as shown in FIGS. 6A, 6B, and 6C, epitaxy semiconductor regions 46 are epitaxially grown in trenches 44 (FIG. 5B). Epitaxy semiconductor regions 46 may comprise silicon germanium, silicon carbon, silicon phosphorous, III-V compound semiconductors, or the like. After the epitaxy, a planarization such as a CMP is performed, so that the top surfaces of epitaxy semiconductor regions 46 are substantially level with the top surfaces of dielectric regions 36 and 42.

Figure 7A:
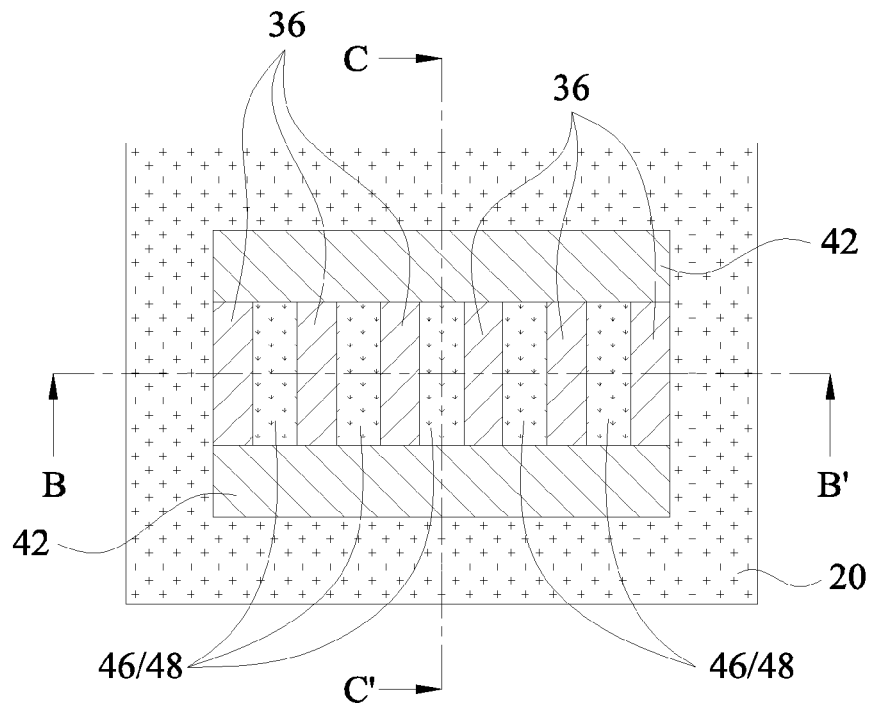
Figure 7B:
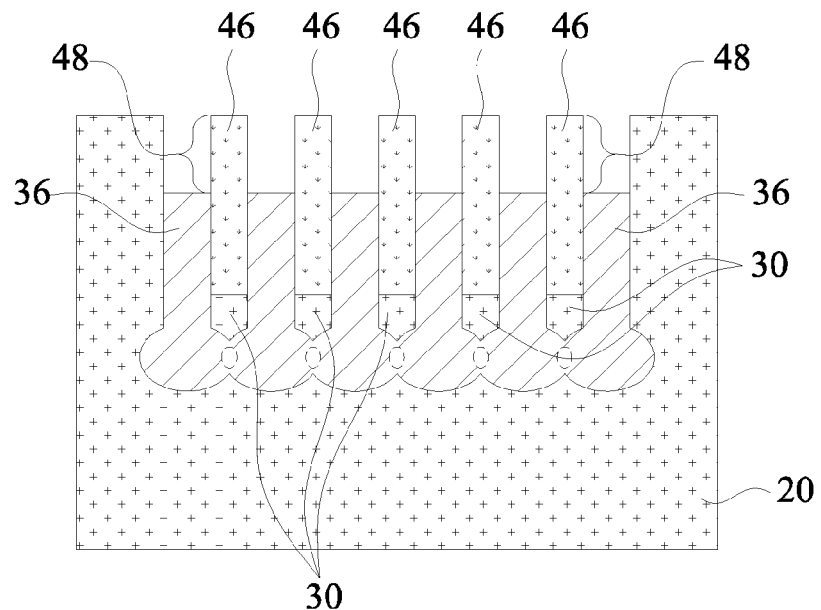
Figure 7C:
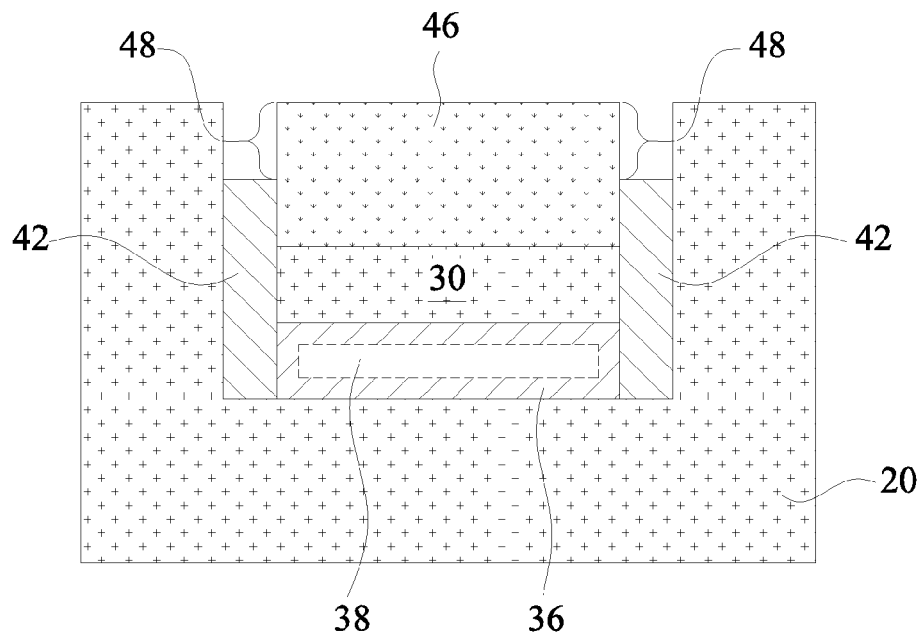

Next, as also shown in FIGS. 7A, 7B, and 7C, dielectric regions 36 and 42 are recessed. The portions of semiconductor strips 30 protruding over the top surfaces of the remaining dielectric regions 36 and 42 become semiconductor fins 48. The recessing of dielectric regions 36 and 42 may be performed using a dry etch process or a wet etch process. In some embodiments, the recessing of dielectric regions 36 and 42 is performed using a dry etch method, in which the process gases including $NH_3$ and HF are used. In alternative embodiments, the recessing of dielectric regions 36 and 42 is performed using a wet etch method, in which the etchant solution includes $NF_3$ and HF. In yet other embodiments, the recessing of dielectric regions 36 and 42 is performed using a dilution HF solution.

Figure 8A:
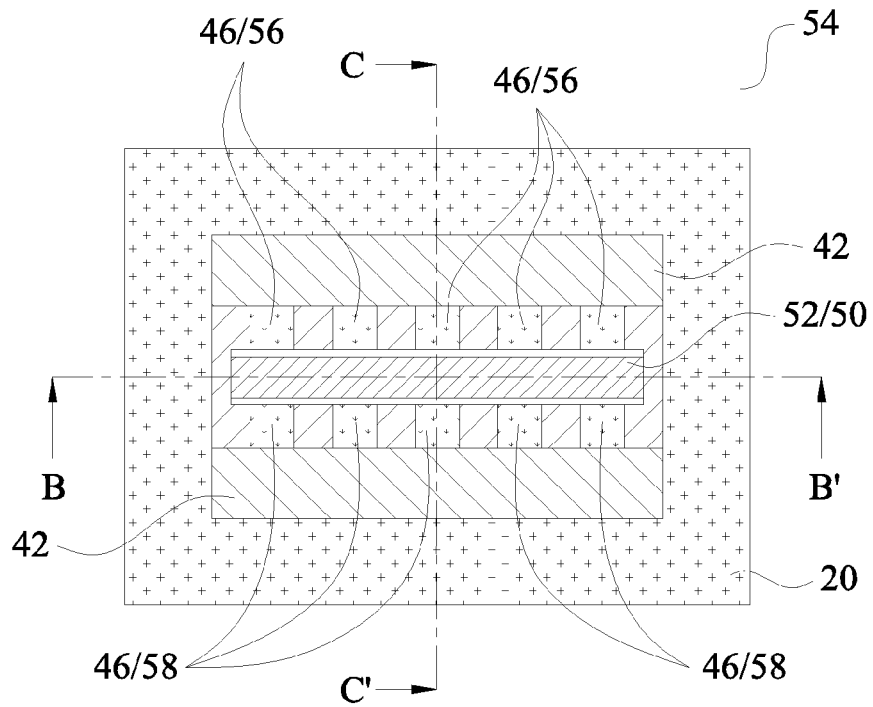
Figure 8B:
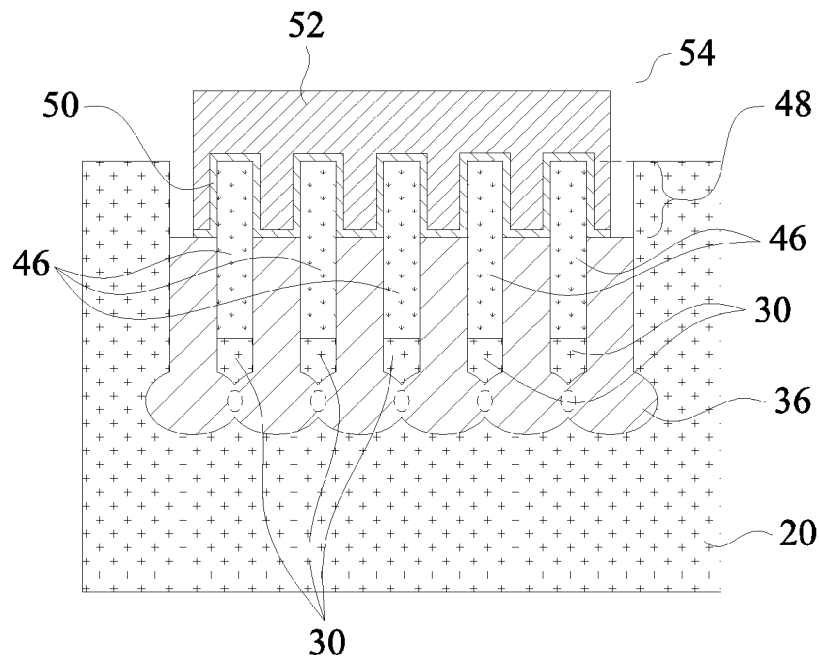
Figure 8C:
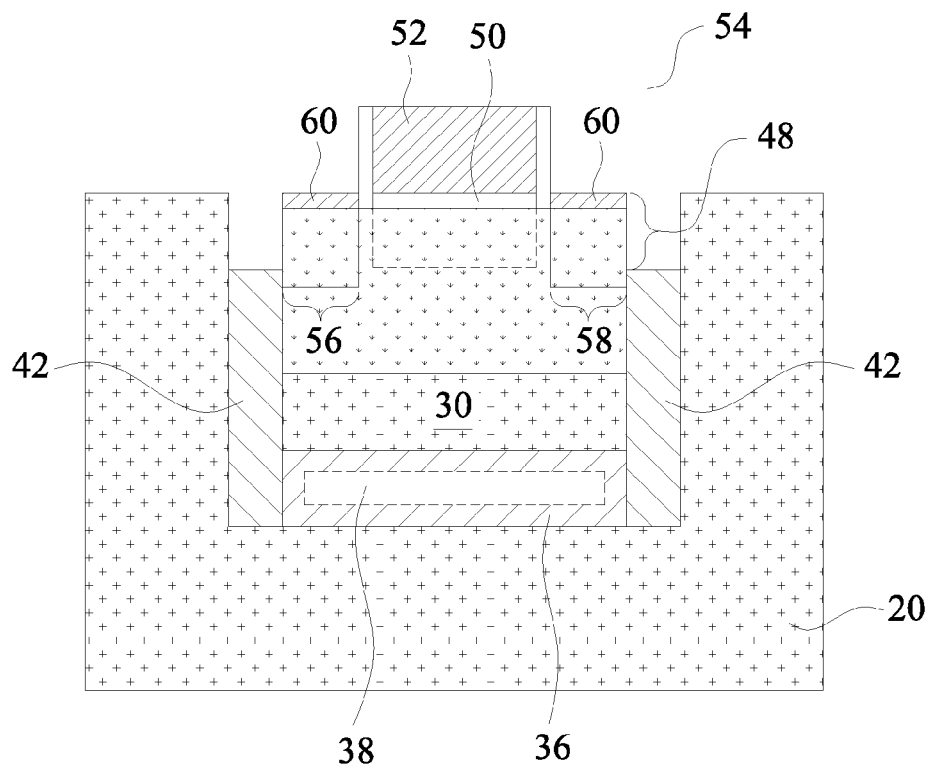

As shown in FIGS. 8A, 8B, and 8C, gate dielectric 50 is formed to cover the top surfaces and sidewalls of fins 48. Gate dielectric 50 may be formed through a thermal oxidation process, and hence may include a thermal silicon oxide. Alternatively, gate dielectric 50 is formed through a deposition step, and may comprise high-k dielectric materials. Gate electrode 52 is then formed on gate dielectric 50. In some embodiments, gate electrode 52 covers a plurality of fins 48, so that the resulting FinFET 54 comprises a plurality of fins 48. In alternative embodiments, each of fins 48 may be used to form one FinFET. The remaining components of FinFET 54, which components include source regions 56, drain regions 58, and source and drain silicide regions 60 (FIGS. 8A and 8C) are then formed. As shown in FIGS. 8A, 8B, and 8C, semiconductor strips 30/44 are fully isolated from substrate 20 by dielectric regions 36 and 42, and hence the leakage current of the resulting FinFET 54 is small.

Figure 9A:
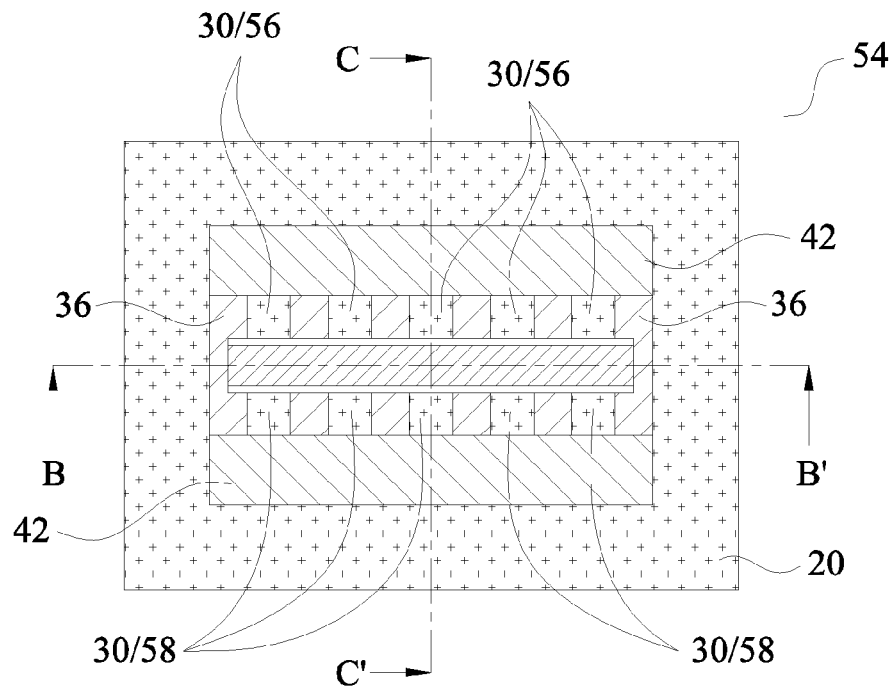
Figure 9B:
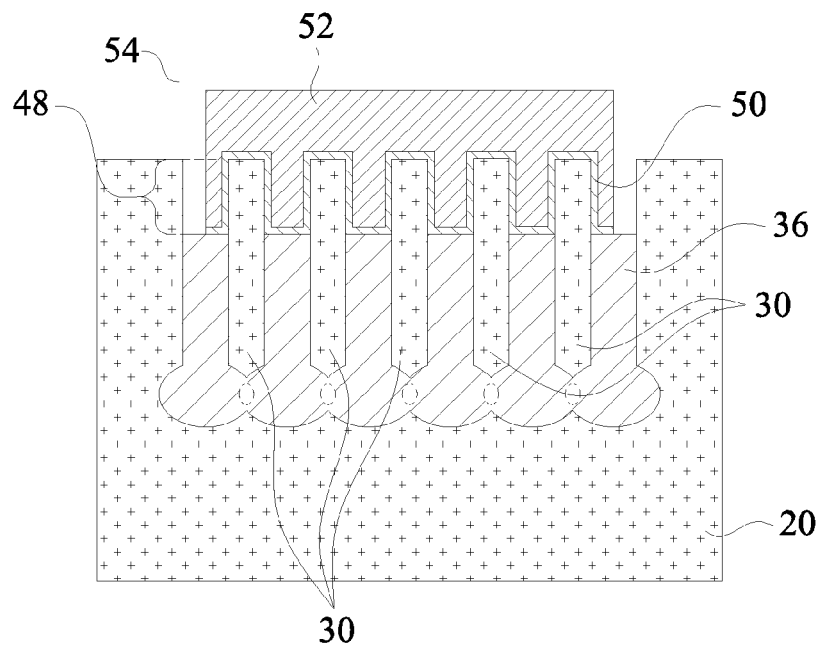
Figure 9C:
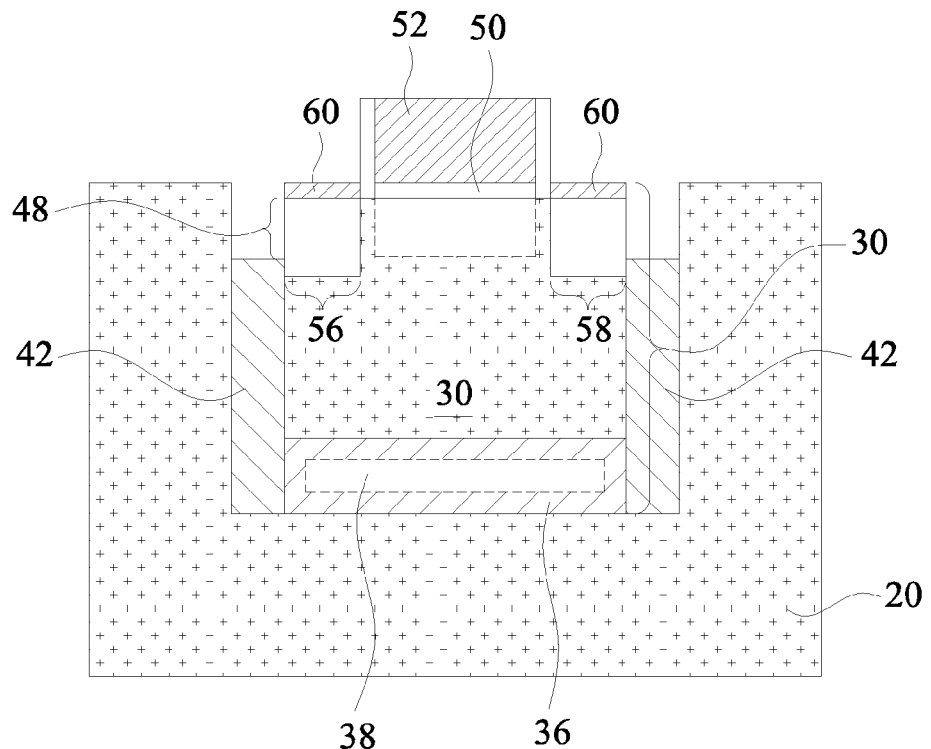

FIGS. 9A, 9B, and 9C illustrate FinFET 54 formed in accordance with alternative embodiments. In these embodiments, the process steps in FIGS. 5A through 6C are skipped, and hence semiconductor strips 30 remain not replaced by epitaxy regions. Accordingly, semiconductor fins 48 are formed of the same material as substrate 20. The remaining process steps and the materials in these embodiments are essentially the same as shown in FIGS. 8A, 8B, and 8C.

In accordance with some embodiments, in the formation of trench portions 26B, as shown in FIG. 1B, the etching time is prolonged. As a result, bottom surfaces 30A of semiconductor strips 30 may be substantially flat. The resulting structure is shown in FIG. 10.

Figure 11:
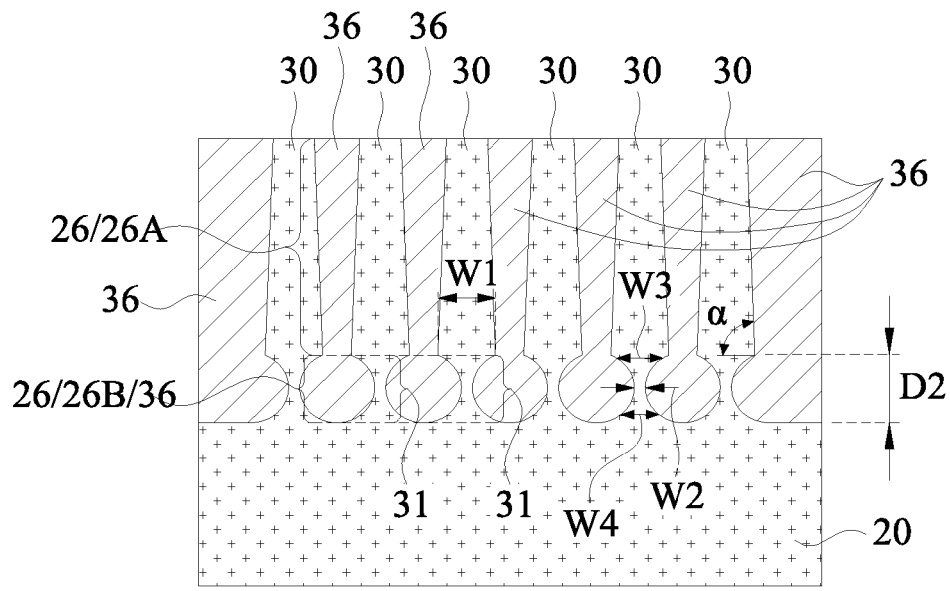
FIG. 11 illustrates a cross-sectional view of isolated semiconductor strips that are not fully separated from the underlying semiconductor substrate in accordance with some exemplary embodiments.

In accordance with alternative embodiments, as shown in FIG. 11, the etching time is shortened, and hence the neighboring trench portions 26B are disconnected from each other. In these embodiments, semiconductor strips 30 are connected to the underlying semiconductor substrate 20 by connecting substrate portions 31, which are narrower than the overlying semiconductor strips 30. Substrate portions 31 may have gradually changed widths, wherein the middle portions of substrate portions 31 have width W2 smaller than widths W3 of the upper portions and widths W4 of the lower portions. The cross-sectional view shapes of trench portions 26B may have the shapes close to circles or ellipses in these embodiments. The profile of trench portions 26B in FIG. 11 may be achieved, for example, by ensuring depth D2 of trench portions 26B smaller than width W1 of semiconductor strips 30.

Figure 12:
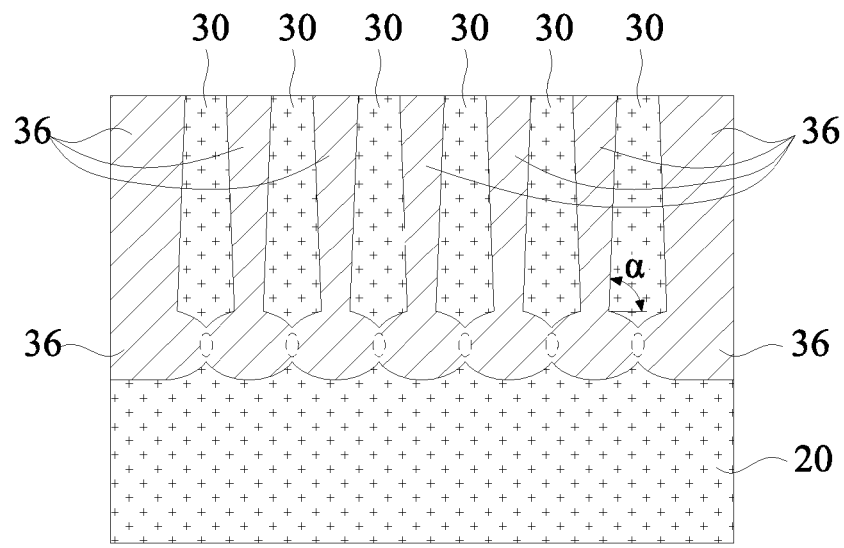
FIG. 12 illustrates a cross-sectional view of isolated semiconductor strips that have non-vertical sidewalls in accordance with some exemplary embodiments.

In accordance with some embodiments, in the formation of trench portions 26B, as shown in FIG. 1B, the process conditions are adjusted, so that the sidewalls of semiconductor strips 30 are vertical. In alternative embodiments, as also shown in FIGS. 11 and 12, the sidewalls of semiconductor strips 30 are slanted. For example, slant angle α of the sidewalls of semiconductor strips 30 may be smaller than about 87 degrees. Similar to the structure shown in FIG. 1B, FIG. 12 illustrates that the bottom surfaces of semiconductor strips 30 are not flat.

Figure 10:
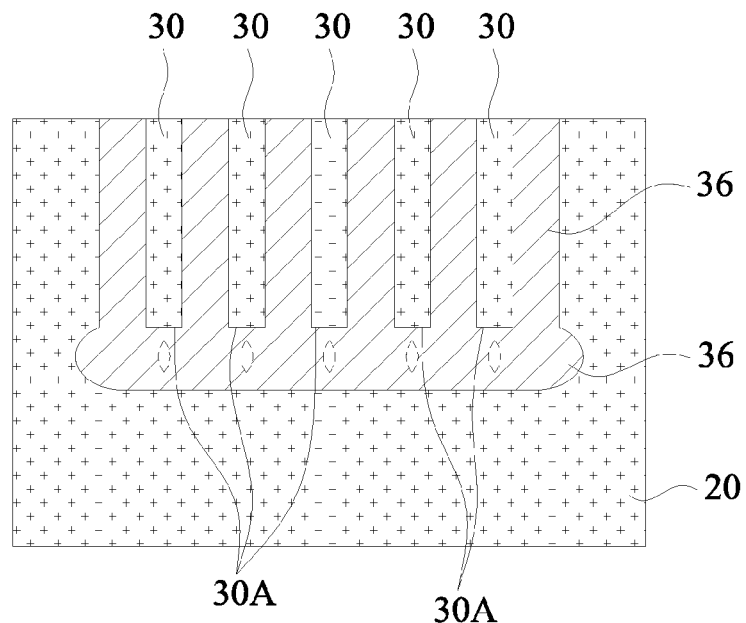
FIG. 10 illustrates a cross-sectional view of isolated semiconductor strips that have substantially flat bottom surfaces in accordance with some alternative embodiments.
Figure 13:
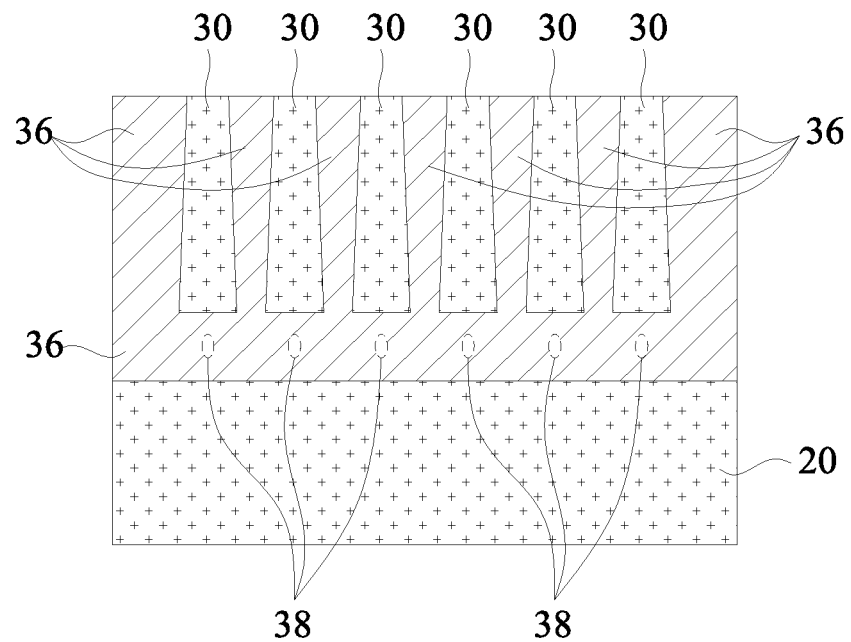
FIG. 13 illustrates a cross-sectional view of isolated semiconductor strips that have non-vertical sidewalls and flat bottom surfaces in accordance with some exemplary embodiments.

Similar to the structure shown in FIG. 10, FIG. 13 illustrates that the bottom surfaces of semiconductor strips 30 are flat, which may be achieved by prolonging the etching time in the formation of trench portions 26B (FIG. 1B). The sidewalls of semiconductor strips 30 in FIG. 13 are slanted and have slant angle α.

In the embodiments of the present disclosure, by expanding the widths of the bottom portions of recesses in the formation of isolation regions, the resulting isolation regions may extend directly underlying the semiconductor strips.

Hence, the semiconductor strips may be fully insulated from the respective substrate, and hence the leakage currents of the resulting FinFETs are reduced.

In accordance with some embodiments, an integrated circuit device includes a semiconductor substrate, and a semiconductor strip extending into the semiconductor substrate. A first and a second dielectric region are on opposite sides of, and in contact with, the semiconductor strip. Each of the first dielectric region and the second dielectric region includes a first portion level with the semiconductor strip, and a second portion lower than the semiconductor strip. The second portion further includes a portion overlapped by the semiconductor strip.

In accordance with other embodiments, an integrated circuit device includes a semiconductor substrate, and a plurality of semiconductor strips extending into the semiconductor substrate. The plurality of semiconductor strips is parallel to each other. The plurality of semiconductor strips has non-flat bottom surfaces. A plurality of dielectric strips is between the plurality of semiconductor strips and separating the plurality of semiconductor strips from each other. A dielectric region is underlying the plurality of semiconductor strips, wherein the dielectric region is in contact with the non-flat bottom surfaces of the plurality of semiconductor strips.

In accordance with yet other embodiments, a method includes performing a first etching to etch a semiconductor substrate and to form top portions of a plurality of trenches, wherein portions of the semiconductor substrate separated by the plurality of trenches form semiconductor strips. A second etching is performed to etch the semiconductor substrate and to form bottom portions of the plurality of trenches. The bottom portions of the trenches are wider than the top portions of the plurality of trenches. A first dielectric material is filled into the top portions and the bottom portions of the plurality of trenches, wherein portions of the first dielectric material in the top portions of the plurality of trenches form dielectric strips. End portions of the dielectric strips and the semiconductor strips are etched to form a first and a second additional trench. The first and the second additional trenches are filled with a second dielectric material to form additional dielectric regions.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. An integrated circuit device comprising:
   a semiconductor substrate;
   a semiconductor strip extending into the semiconductor substrate;
   a first and a second dielectric region on opposite sides of, and in contact with, the semiconductor strip, wherein each of the first dielectric region and the second dielectric region comprises:
      a first portion level with the semiconductor strip; and
      a second portion lower than the semiconductor strip, wherein the second portion further comprises a portion overlapped by the semiconductor strip; and
   an air gap underlying and overlapped by the semiconductor strip, wherein the air gap is enclosed by dielectric materials.

2. The integrated circuit device of claim 1, wherein the second portion of the first dielectric region is continuously joined to the second portion of the second dielectric region, with no distinguishable interface between the second portion of the first dielectric region and the second portion of the second dielectric region.

3. The integrated circuit device of claim 1, wherein the first dielectric region and the second dielectric region have lengthwise directions parallel to a lengthwise direction of the semiconductor strip, and wherein the integrated circuit device further comprises:
   a third and a fourth dielectric region on opposite ends of, and in contact with, the semiconductor strip, wherein each of the third dielectric region and the fourth dielectric region is in contact with the first and the second dielectric region.

4. The integrated circuit device of claim 3, wherein the first and the second dielectric regions are formed of a first dielectric material, and wherein the third and the fourth dielectric regions are formed of a second dielectric material different from the first dielectric material.

5. The integrated circuit device of claim 1, wherein a top portion of the semiconductor strip is higher than top surfaces of the first and the second dielectric regions, with the top portion of the semiconductor strip forming a semiconductor fin, and wherein the integrated circuit device further comprises:
   a gate dielectric on sidewalls and a top surface of the semiconductor fin;
   a gate electrode over the gate dielectric; and
   a source region and a drain region on opposite sides of the gate dielectric.

6. The integrated circuit device of claim 5, wherein the air gap comprises a first portion overlapped by the source region, a second portion overlapped by the drain region, and a third portion connecting the first portion to the second portion.

7. The integrated circuit device of claim 1, wherein the air gap has a strip shape, and is overlapped by a center portion of the semiconductor strip.

8. The integrated circuit device of claim 1, wherein the semiconductor strip comprises a downwardly pointing tip overlapping the air gap.

9. An integrated circuit device comprising:
   a semiconductor substrate;
   a plurality of semiconductor strips extending into the semiconductor substrate, wherein the plurality of semiconductor strips is parallel to each other, and wherein the plurality of semiconductor strips comprises non-flat bottom surfaces;

a plurality of dielectric strips between the plurality of semiconductor strips and separating the plurality of semiconductor strips from each other; and a dielectric region underlying the plurality of semiconductor strips, wherein the dielectric region is in contact with the non-flat bottom surfaces of the plurality of semiconductor strips, and wherein the dielectric region is formed of a homogeneous material that extends continuously underlying the plurality of semiconductor strips and the plurality of dielectric strips, with no distinguishable interface in the dielectric region.

10. The integrated circuit device of claim 9 further comprising a first and a second dielectric region contacting end edges of the plurality of semiconductor strips and end edges of the plurality of dielectric strips.

11. The integrated circuit device of claim 9, wherein the dielectric region comprises a first portion and a second portion overlapped by a first and a second one of the plurality of semiconductor strips, respectively, and wherein no distinguishable interface is formed between the first portion and the second portion of the dielectric region.

12. The integrated circuit device of claim 9 further comprising a plurality of air gaps, each overlapped by one of the plurality of semiconductor strips.

13. The integrated circuit device of claim 12, wherein one of the semiconductor strips comprises a downwardly pointing tip directly over one of the plurality of air gaps.

14. The integrated circuit device of claim 9, wherein each of the plurality of semiconductor strips comprises:
 a top portion formed of a first semiconductor material different from a semiconductor material of the semiconductor substrate; and
 a bottom portion formed of a second semiconductor material same as the semiconductor material of the semiconductor substrate.

15. An integrated circuit device comprising:
 a semiconductor substrate;
 a semiconductor strip extending into the semiconductor substrate, wherein the semiconductor strip has a first lengthwise direction parallel to a major surface of the semiconductor substrate;
 a first dielectric region comprising:
  a first and a second portion on opposite sides of, and in contact with, sidewalls of the semiconductor strip, wherein the first portion and the second portion have lengthwise directions parallel to the first lengthwise direction; and
  a third portion extending underlying the semiconductor strip, wherein the third portion comprises a top surface in contact with a bottom surface of the semiconductor strip;
 a second dielectric region extending into the semiconductor substrate, wherein the second dielectric region has a second lengthwise direction perpendicular to the first lengthwise direction, and the second dielectric region comprises an edge in contact with end edges of the semiconductor strip and the first and the second portions of the first dielectric region, and wherein the first dielectric region and the second dielectric region form distinguishable interfaces; and
 an air gap in the third portion of the first dielectric region.

16. The integrated circuit device of claim 15, wherein the first dielectric region and the second dielectric region are formed of a same dielectric material.

17. The integrated circuit device of claim 15, wherein the first dielectric region and the second dielectric region are formed of different dielectric materials.

18. The integrated circuit device of claim 15, wherein the air gap has a lengthwise direction parallel to the first lengthwise direction.

19. The integrated circuit device of claim 15, wherein the air gap is overlapped by a center portion of the semiconductor strip, and wherein the semiconductor strip further comprises additional portions on opposite sides of the center portion, with the additional portions of the semiconductor strip not overlapping the air gap.

20. The integrated circuit device of claim 15, wherein the air gap comprises opposite curved sidewalls curving in opposite directions.

* * * * *